(12) United States Patent
Finnerty et al.

(10) Patent No.: US 9,840,025 B2
(45) Date of Patent: *Dec. 12, 2017

(54) PROCESS FOR PRODUCING TUBULAR CERAMIC STRUCTURES

(71) Applicant: Watt Fuel Cell Corp., Mount Pleasant, PA (US)

(72) Inventors: Caine M. Finnerty, Port Washington, NY (US); Benjamin J. Emley, Bolivar, OH (US)

(73) Assignee: WATT FUEL CELL CORP., Mount Pleasant, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,031

(22) Filed: Sep. 1, 2016

(65) Prior Publication Data

US 2016/0368164 A1 Dec. 22, 2016

Related U.S. Application Data

(63) Continuation of application No. 13/223,349, filed on Sep. 1, 2011, now Pat. No. 9,452,548.

(51) Int. Cl.
*B28B 21/88* (2006.01)
*B28B 7/30* (2006.01)
(Continued)

(52) U.S. Cl.
CPC ............. *B28B 21/88* (2013.01); *B05D 1/02* (2013.01); *B05D 1/18* (2013.01); *B28B 7/30* (2013.01);
(Continued)

(58) Field of Classification Search
CPC ......... B28B 21/86; B28B 21/88; B28B 21/73; B28B 21/42; B28B 21/44; B05D 1/002; B05D 1/005; B32B 7/30
See application file for complete search history.

(56) References Cited

U.S. PATENT DOCUMENTS 3,689,614 A * 9/1972 Bortz ................. B28B 1/523
264/108
4,460,529 A 7/1984 Schultze et al.
(Continued)

FOREIGN PATENT DOCUMENTS

CA 2846864 A1 6/2013
GB 1 258 262 A 12/1971
(Continued)

OTHER PUBLICATIONS

Lendlein, et al., "Shape-Memory Effect", Angew. Chem. Int. Ed. vol. 41, pp. 2034-2057 (2002).
(Continued)

*Primary Examiner* — Stella Yi
(74) *Attorney, Agent, or Firm* — Dilworth & Barrese, LLP.; Michael J. Musella (57) ABSTRACT

Tubular ceramic structures, e.g., anode components of tubular fuel cells, are manufactured by applying ceramic-forming composition to the external surface of the heat shrinkable polymeric tubular mandrel component of a rotating mandrel-spindle assembly, removing the spindle from the assembly after a predetermined thickness of tubular ceramic structure has been built up on the mandrel and thereafter heat shrinking the mandrel to cause the mandrel to separate from the tubular ceramic structure.

20 Claims, 4 Drawing Sheets

(51) Int. Cl.

| | | |
|---|---|---|
| *B28B 7/34* | (2006.01) | |
| *B28B 21/44* | (2006.01) | |
| *B28B 21/90* | (2006.01) | |
| *C23C 24/04* | (2006.01) | |
| *H01M 8/124* | (2016.01) | |
| *H01M 4/88* | (2006.01) | |
| *H01M 8/00* | (2016.01) | |
| *C23C 14/34* | (2006.01) | |
| *B05D 1/02* | (2006.01) | |
| *B05D 1/18* | (2006.01) | |
| *H01M 4/90* | (2006.01) | |
| *H01M 4/86* | (2006.01) | |

(52) U.S. Cl.
CPC .............. *B28B 7/348* (2013.01); *B28B 21/44* (2013.01); *B28B 21/905* (2013.01); *C23C 14/3414* (2013.01); *C23C 24/04* (2013.01); *H01M 4/8652* (2013.01); *H01M 4/8668* (2013.01); *H01M 4/8673* (2013.01); *H01M 4/886* (2013.01); *H01M 4/8814* (2013.01); *H01M 4/8828* (2013.01); *H01M 4/8882* (2013.01); *H01M 4/9025* (2013.01); *H01M 4/9066* (2013.01); *H01M 8/004* (2013.01); *H01M 8/124* (2013.01); *B05D 2201/02* (2013.01); *B05D 2254/02* (2013.01); *H01M 4/8885* (2013.01); *H01M 2004/8684* (2013.01); *H01M 2008/1293* (2013.01); *Y02E 60/50* (2013.01); *Y02E 60/525* (2013.01); *Y02P 70/56* (2015.11)

(56) References Cited

U.S. PATENT DOCUMENTS

| | | | |
|---|---|---|---|
| 6,251,473 | B1 | 6/2001 | Wang et al. |
| 6,492,050 | B1 | 12/2002 | Sammes |
| 6,787,261 | B2 | 9/2004 | Ukai et al. |
| 7,410,717 | B2 | 8/2008 | Moon et al. |
| 7,422,714 | B1 | 9/2008 | Hood et al. |
| 7,498,095 | B2 | 3/2009 | Finnerty et al. |
| 7,604,699 | B2 | 10/2009 | Chen et al. |
| 7,704,617 | B2 | 4/2010 | Venkataraman |
| 7,727,450 | B1 | 6/2010 | Berger et al. |
| 7,910,038 | B2 | 3/2011 | Kia et al. |
| 2003/0077504 | A1 | 4/2003 | Hara et al. |
| 2005/0042490 | A1 | 2/2005 | Finnerty et al. |
| 2005/0153178 | A1 | 7/2005 | Ahmed et al. |
| 2008/0131586 | A1 | 6/2008 | Hama |
| 2009/0023050 | A1 | 1/2009 | Finnerty et al. |
| 2009/0269481 | A1 | 10/2009 | Chappa et al. |
| 2010/0078496 | A1 | 4/2010 | Massimi |

FOREIGN PATENT DOCUMENTS

| | | |
|---|---|---|
| GB | 2 067 459 A | 7/1981 |
| JP | 5775807 | 5/1982 |
| JP | 59103712 | 6/1984 |
| JP | H02289306 | 11/1990 |
| JP | 9 193127 A | 7/1997 |
| NL | 8 302 819 A | 3/1985 |
| RU | 2105921 | 2/1998 |
| SU | 131466 | 11/1959 |
| SU | 271358 | 9/1970 |
| SU | 850403 | 7/1981 |
| SU | 905110 | 2/1982 |
| WO | 2002/060620 A1 | 8/2002 |
| WO | 02060620 | 8/2002 |
| WO | 2013-033512 A3 | 3/2013 |

OTHER PUBLICATIONS

Ultrasonic Nozzle Flow Rate Ranges, http://www.sono-tek.com/industrial/page/flow_rate; retrieved on Jul. 21, 2011.
Ultrasonic Nozzle Teohnology, http://www.sono-tek.com/industrial/page/ultrasonic_nozzle, retrieved on Jul. 21, 2011.
Ultrasonic Nozzle Compatibility with Various Liquids, http://www.sono-tek.com/industrial/page/Compatibility; retrieved on Jul. 21, 2011.
Ultrasonic Nozzle for Fuel Cell Production, http://www.sono-tek.com/industrial/page/overview; retrieved on Jun. 27, 2011.
ExtraCoat Programmable Coater, http://www.sono-tek.com/electronics/page/exactacoat-benchtop; retrieved on Jun. 16, 2011.
FlexiCoat Inline Programmable Coater, http://www.sono-tek.com/electronics/page/flexicoat-inline; retreved on Jun. 16, 2011.
International Search Report and Written Opinion dated Feb. 7, 2013.

* cited by examiner

PROCESS FOR PRODUCING TUBULAR CERAMIC STRUCTURES

REFERENCE TO PRIOR APPLICATIONS

This application is a continuation of prior application Ser. No. 13/223,349, filed Sep. 1, 2011, the entire contents of which are incorporated herein by reference.

BACKGROUND OF THE INVENTION

This invention relates to a process for producing tubular ceramic structures.

Tubular ceramic structures are known for use as heat exchangers where corrosive liquids or gases are encountered, recuperators, catalyst bodies, as components of fuel cells, particularly solid oxide fuel cells (SOFCs), and in a variety of other applications.

Tubular ceramic structures can be produced in a broad range of lengths, wall thicknesses and cross-sectional areas and geometries employing any of several known and conventional techniques such as extrusion and dip coating. Each of these techniques for producing tubular ceramic structures generally, and tubular components of SOFCs in particular, is subject to certain inherent drawbacks and/or limitations.

In the case of extrusion, due to the need for the tubular extrudate to remain intact as it emerges from the extruder orifice, the ratio of the diameter of the tube to its wall thickness is typically low, e.g., under 15 and commonly under 10. This practical requirement tends to limit the usefulness of extrusion methods to the production of relatively thick-walled tubular ceramic structures. While relatively thick-wailed tubular anodes can be advantageous for the construction of some types of SOFC devices, in particular, those intended for high power output (e.g., 20 KW and above), relatively thin-walled tubular anodes are generally preferred for the construction of SOFC devices of lower power output where their low thermal mass favors quicker start-ups and/or frequent on-off cycling.

The requirement for a relatively thick-walled extrudate, which can only be achieved with an extrudable material of fairly high viscosity, e.g., one of paste- or putty-like consistency, imposes yet another limitation on the usefulness of extrusion methods for the manufacture of tubular ceramic structures, namely, the need to carefully and completely dry the extrudate before subjecting it to such high temperature downstream processes as the burning out of organics (i.e., residual solvent(s), dispersant(s), binder(s), etc.) and sintering. The drying of the extrudate requires suitable control over such operational parameters as temperature, humidity and time. Too rapid drying and/or insufficient drying can result in the production of mechanical defects in the extrudate before and/or after carrying out either or both of the aforementioned high temperature post-extrusion processes.

Still another limitation of the extrusion technique is its inability to readily vary the composition of the extruded tube, e.g., to alter the composition of the tube in one preselected location but not in another.

In the case of dip coating, the requirement that the ceramic-forming composition be applied to a tubular substrate generally limits this technique to the production of structures in which the substrate becomes an integral, functional component of the final article. This requirement for a tubular substrate necessarily restricts the type as well as the design of those devices that can utilize a tubular ceramic article produced by the dip coating technique. Moreover, it is difficult in practice to provide tubular ceramic structures with relatively thin walls and/or with walls of uniform thickness employing dip coating.

There exists a need for a process for producing tubular ceramic structures that is not subject to any of the aforedescribed drawbacks and limitations of known and conventional extrusion and dip coating techniques. More particularly, there is a need for a process which with equal facility is capable of producing tubular ceramic structures over a broad range of wall thicknesses, from the very thin to the very thick, does not require close attention to and control of the conditions of drying, is readily capable of altering or modifying the composition of the tubular product for a defined portion thereof and does not require the use of a tubular substrate which is destined to become a permanent component of the product.

SUMMARY OF THE INVENTION

In accordance with the present invention, a process for producing tubular ceramic structures is provided which comprises:

a) rotating a mandrel-spindle assembly comprising a mandrel component and a spindle component, the mandrel component being a heat shrinkable polymeric tube the external surface of which corresponds to the internal surface of the tubular ceramic structure to be produced and the internal surface of which defines a bore, the spindle component being in close fitting but slidably removable contact therewith;

b) applying a ceramic-forming composition to the external surface of the mandrel component of the rotating mandrel-spindle assembly to produce a tubular ceramic structure the internal surface of which is in contact with the external surface of the mandrel;

c) removing the spindle from the bore of the mandrel to provide a mandrel-tubular ceramic structure assembly in which the interior surface of the tubular ceramic structure remains in contact with the external surface of the mandrel; and, d) heat shrinking the mandrel component of the mandrel-tubular ceramic structure assembly to cause the mandrel to undergo shrinkage to a reduced size in which the external surface of the mandrel separates from the interior surface of the tubular ceramic structure facilitating removal of the mandrel therefrom.

A major advantage and benefit of the foregoing process for producing a tubular ceramic structure lies in its ability to provide ceramic or cermet bodies over a wide range of ratios of length to external diameter and ratios of external diameter to wall thickness while meeting very precise predetermined dimensional tolerances.

Another advantage of the process herein for producing a tubular ceramic structure is its capability for readily and conveniently varying, or modifying, the ceramic-forming composition along the length of the structure. Ceramic-forming formulations of differing composition can be readily applied in a controlled manner to the external surface of the rotating mandrel at different rates and/or at different times during the production process. The degree of separation or blending of different ceramic-forming formulations during the production process can also be carefully controlled employing calibrated dispensing equipment known in the art to provide tubular ceramic products with enhanced performance capabilities compared with tubular products made by other fabrication techniques such as extrusion and dip coating.

The process of the invention can also utilize quick-drying ceramic-forming compositions thus dispensing with the need for a carefully conducted and monitored drying operation.

And, since the heat-shrinkable tubular mandrel upon which the tubular ceramic structure is first formed when carrying out the process of this invention is eventually separated from the tubular product, there is no requirement that the latter be permanently united to a tubular substrate as is the case with dip coating.

BRIEF DESCRIPTION OF THE DRAWINGS

In the accompanying drawings in which like reference numerals refer to like elements.

DETAILED DESCRIPTION OF THE INVENTION

It is to be understood that the invention herein is not limited to the particular procedures, materials and modifications described and as such may vary. It is also to be understood that the terminology used is for purposes of describing particular embodiments only and is not intended to limit the scope of the present invention which will be limited only by the appended claims.

In the specification and claims herein, the following terms and expressions are to be understood as indicated.

The singular forms "a," "an," and "the" include the plural.

All methods described herein may be performed in any suitable order unless otherwise indicated herein or otherwise clearly contradicted by context. The use of any and all examples, or exemplary language provided herein, e.g., "such as", is intended merely to better illuminate the invention and does not pose a limitation on the scope of the invention unless otherwise claimed. No language in the specification should be construed as indicating any non-claimed element as essential to the practice of the invention.

As used herein, "comprising," including," "containing," "characterized by", and grammatical equivalents thereof are inclusive or open-ended terms that do not exclude additional, unrecited elements or method steps, but will also be understood to include the more restrictive terms "consisting of" and "consisting essentially of."

Other than in the working examples or where otherwise indicated, all numbers expressing amounts of materials, reaction conditions, time durations, quantified properties of materials, and so forth, stated in the specification and claims are to be understood as being modified in all instances by the term "about."

It will be understood that any numerical range recited herein includes all sub-ranges within that range and any combination of the various endpoints of such ranges or sub-ranges.

It will be further understood that any compound, material or substance which is expressly or implicitly disclosed in the specification and/or recited in a claim as belonging to a group of structurally, compositionally and/or functionally related compounds, materials or substances includes individual representatives of the group and all combinations thereof.

The expressions "heat shrinkable polymer" and "shape-memory polymer" as used herein shall be understood as mutually inclusive.

The expression "ceramic-forming composition" shall be understood to include "cermet-forming composition."

The expression "external surface of the mandrel component" shall be understood to include the initially bare, or uncoated, external surface of the mandrel, i.e., the external surface of the mandrel prior to the application of some other material thereto, and the external surface of any material that has accumulated upon the external surface of the mandrel during its deposition thereon.

The expression "tubular ceramic structure" shall be understood to include all shape-sustaining tubular ceramic structures whether in an intermediate or final stage of production, e.g., as including tubular ceramic structures in the green state, i.e., those containing organic matter such as dispersant, binder, etc., where present in the ceramic-forming composition from which the structures are formed, and the organic matter-free tubular ceramic structures resulting from the burning out of such matter or from a sintering operation.

All referenced publications are incorporated by reference herein in their entirety for the purpose of describing and disclosing, for example, materials, constructs and methodologies that can be used in connection with the presently described invention.

Figure 1:
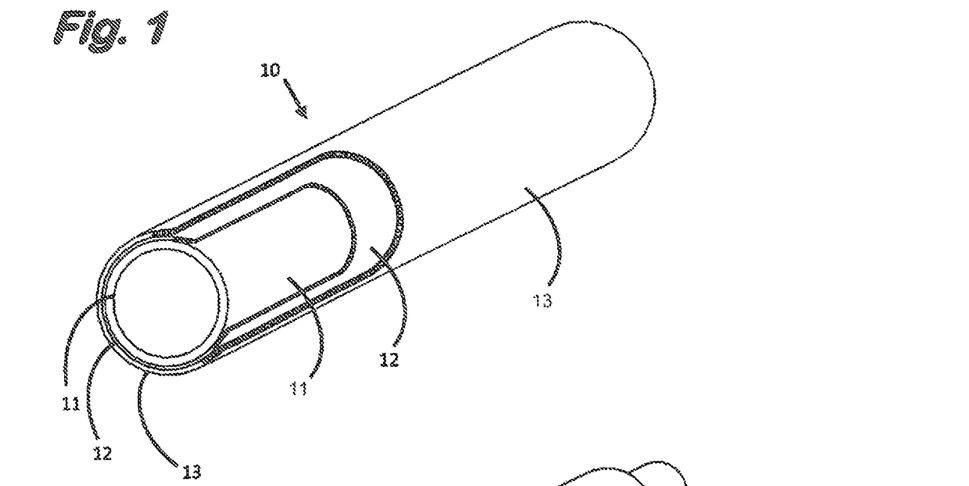
FIG. 1 is an isometric view of a generally cylindrical tubular SOFC unit with portions partially cut away to better illustrate its anode, electrolyte and cathode components, the anode component being advantageously produced in accordance with the process of the invention.

Referring now to the figures, FIG. 1 is a perspective partially cut away view of generally cylindrically shaped tubular SOFC unit 10 possessing an interior cermet-based, pore-containing anode component (i.e., fuel electrode) 11, the interior surface of which defines a bore, or passageway, 14, intermediate electrolyte component 12 and cathode component 13.

While the process of the invention is generally applicable to the production of all tubular ceramic structures, it will now be specifically illustrated for the production of tubular anode component 11 of tubular SOFC unit 10 shown in FIG. 1.

Tubular anode component 11 produced from an anode-forming composition containing metal and ceramic compounds in particulate form. The particulate ceramic can be at least one member selected from the group consisting of yttrium oxide, zirconium oxide, cerium oxide, lanthanum oxide, gallium oxide, strontium oxide, magnesium, scandium oxide, samarium oxide, praseodymium oxide and mixtures thereof. The particulate source of metal can be at least one member selected from the group consisting of nickel, copper, silver, platinum, ruthenium, palladium compounds and mixtures thereof. A slurry-forming amount of solvent or mixture of solvents such as water, organic solvent such as methanol, ethanol, propanol, 2-butoxyethanol, acetone, dimethylketone, methylethylketone, etc., or aqueous solution of one or more organic solvents such as any of the foregoing is used to provide a slurry of the particulates. Water is generally preferred for this purpose due to its negligible cost and its avoidance of environmental concerns such as flammability and toxicity which are generally associated with the use of volatile organic solvents.

The particulates may be maintained in suspension within the slurry with the aid of a dispersant, or suspending agent, of which many kinds are known in the art, e.g., polymer electrolytes such as polyacrylic acid and ammonium polyacrylate; organic acids such a citric acid and tartaric acid; copolymers of isobutylene and/or styrene with maleic anhydride, and ammonium salts and amine salts thereof; copolymers of butadiene with maleic anhydride, and ammonium salts thereof; and, phthalate esters such as dibutyl phthalate and dioctyl phthalate and mixtures of these and other dispersants.

Figure 3:
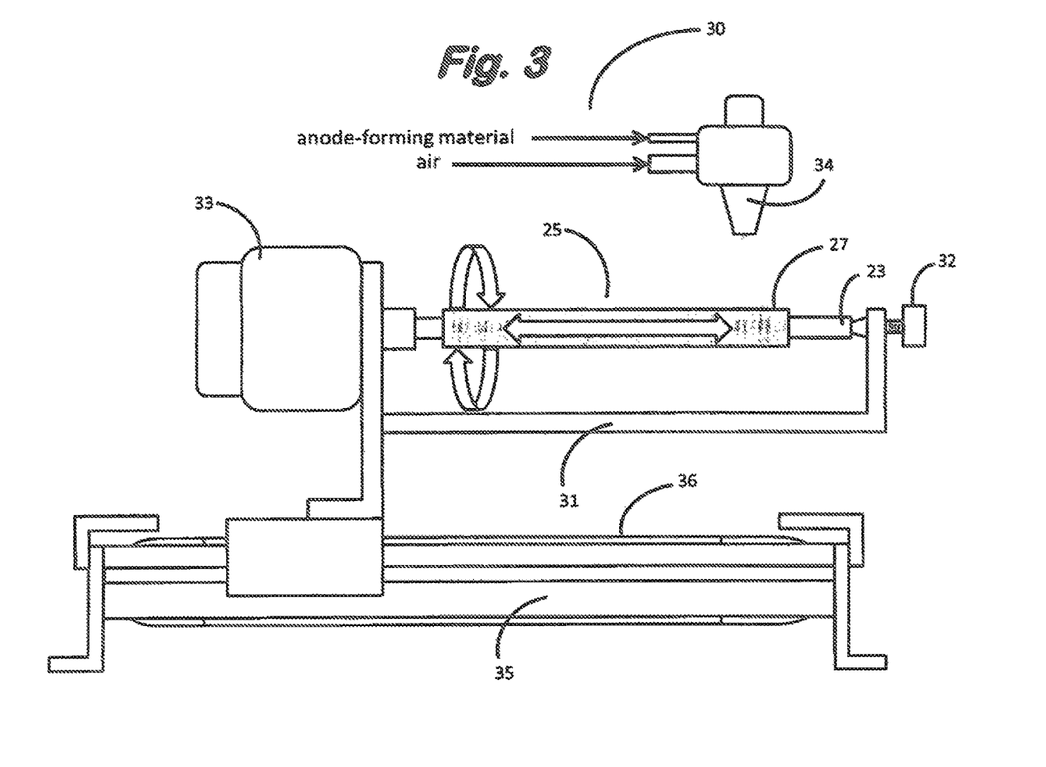
FIG. 3 illustrates the application of an anode-forming composition to the rotating mandrel-spindle assembly of FIG. 2C employing an ultrasonic spraying operation to produce the tubular anode.

An organic binder is incorporated in the anode-forming composition in order to solidify, or set-up, the anode-forming composition into a shape-sustaining mass as it is applied to the external surface of the rotating mandrel during the spraying operation shown in FIG. 3. The organic binder may be one that undergoes gelling by a physical mechanism, e.g., swelling in the presence of water and/or organic liquid, or by a chemical mechanism, e.g., crosslinking of polymer chains, or a combination of binders that individually undergo gelling, one by a physical mechanism, another by a chemical mechanism. Useful gelling binders include such water-soluble and/or water-dispersible substances as methylcellulose, hydroxymethylcellulose, polyvinyl alcohol, polyvinyl acetate, polyvinyl butyral, polyhydroxyethylmethacrylate, polyvinylpyrrolidone (also capable of functioning as a dispersant), polysaccharides such as starch, modified starch, alginate, gum arabic, agar-agar, and the like. Useful binders of the cross-linkable polymer variety include polyacrylamides, polyacrylates, polymethylmethacrylates, and the like, crosslinked in situ employing known and conventional initiators such as peroxides, persulfates, etc.

One or more known or conventional additives such as plasticizers, e.g., polyethylene glycol, surfactants, foaming agents, defoaming agents, wetting agents, and the like, in art-recognized amounts can also be used to ensure a well-dispersed, homogeneous and eventually self-supporting composition (see R. J. Pugh et al., "Surface and Colloid Chemistry in Advanced Ceramics Processing", Marcel Dekker, October 1993). The physical characteristics of these anode-forming compositions such as their viscosity and the time required for their transition from a fluid state to a shape-sustaining state can be controlled through selection of the components of the compositions and/or their amounts.

The ceramic material incorporated in anode component 11 (and in electrolyte component 13) can be stabilized-zirconia, preferably utilized for high operating temperature SOFCs (700° C. to 1000° C.). This includes preferably 8 mol % yttria-stabilized zirconia ("Y8SZ"), $(ZrO_2)_{0.92}(Y_2O_3)_{0.08}$. Another useful material is doped-ceria, preferably used for intermediate operating temperature SOFCs (500° C. to 700° C.). This includes preferably gadolinium-doped ceria ("CGO"), $(Ce_{0.90}Gd_{0.10})O_{1.95}$. However, each of these materials may be employed over a wide range of temperatures. Of course, it is contemplated that other materials suitable for SOFC applications known in the art may be used.

The metal phase used in the anode and electrolyte components belongs, preferably, to the transition group of metals of the periodic table of elements, their alloys or physical mixtures. Nickel (Ni) is preferred, because of its high electrical conductivity under reducing atmosphere and its cost effectiveness. Metal may be introduced in the supported fuel electrode and cermet electrolyte via different precursors, known to those skilled in the art such as metal powders, metal oxide powders, and metal salts (aqueous or non-aqueous). Metal oxide powders, such as green NiO, are often preferred because of their cost effectiveness and their adaptability to ceramic processing. The use of fine metal oxide powders is particularly recommended for the cermet electrolyte processing since the metal will remain oxidized under SOFC operating conditions.

The metal phase range may vary from 30 vol % to 80 vol % in the cermet anode. The thickness in the sintered state of the cermet anode will depend on the overall design of the fuel cell. For example, anode thickness in small diameter tubular fuel, cells can range from 0.2 mm to 1.0 mm.

The metal Phase range can vary from 0.1 vol % to 15 vol % in the cermet electrolyte. The thickness of the cermet electrolyte in the sintered state is preferably below 500 microns and most preferably is between 5-30 microns. The specific thickness chosen will often be determined by the size and design of the fuel cell as well as other factors apparent to those skilled in the art.

The viscosity of a ceramic-forming composition can vary within fairly wide limits, e.g., from 1 to 500,000 cP at 20° C. For the ultrasonic spraying operation for making a tubular anode structure described, infra, in connection with FIG. 3, the viscosity of the anode-forming composition ran range, e.g., from 1 to 100 cP at 20° C., and preferably from 5 to 20 cP at 20° C.

The use of a relatively thick-walled anode support, e.g., one having a wall thickness of from 0.9 to 5.0 mm with a diameter up to 500 mm, can allow the use of relatively thin subsequently formed electrolyte and/or cathode components, e.g., an electrolyte layer having a thickness of from 0.005 to 0.500 mm and/or a cathode layer having a thickness of from 0.010 to 1 mm. A reduced thickness for the electrolyte and/or cathode components can provide improved thermal shock resistance and electrochemical performance. Such improved mechanical stability and fuel cell performance may also enable the fuel cell to operate at a lower temperature. This in turn can allow the use of more cost-effective materials (e.g., stainless steel) within the fuel cell stack (e.g., for cell manifolding).

The use of relatively thin-walled anode support, e.g., one having a wall thickness of from 0.020 to 2 mm with a diameter up to 30 mm, can be advantageous for use, an noted above, in the construction of lower power output SOFC devices (e.g., below 20 KW and more commonly below 5 KW) where their lower thermal mass tends to better accommodate quicker start-ups and/or frequent on-off cycling.

The process of this invention also allows for the optional deposition of a thin interlayer between the anode and/or cathode component(s) of the SOFC and its electrolyte component. It can be advantageous to provide an optional interlayer thin film between anode 11 and electrolyte 12, between electrolyte 12 and cathode 13, or between electrolyte 12 and both anode 11 and cathode 13 as interlayer thin films can be made to increase fuel cell performance, e.g., through the use of catalytic materials, and/or prevent or inhibit adverse chemical reactions during sintering. An interlayer thin film can include one or more catalytically active materials such as doped cerium and gadolinium oxide (COO), as previously disclosed, in a range of from 40 to 60 vol %, with the balance being Ni and Ru. Other catalytically active materials include scandium-stabilized zirconia (SSZ), again with the balance being Ni and Ru. An interlayer thin film can contain still other catalytically active components such as Pt, Pd and Rh to name but a few.

Figure 2A:
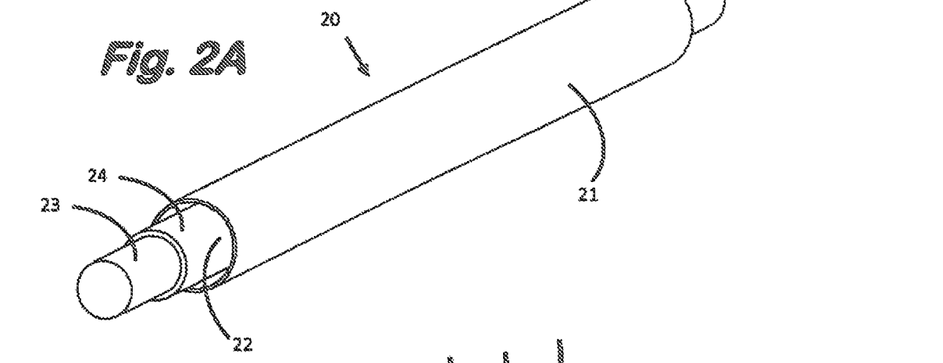
FIGS. 2A-2C illustrate the formation of a mandrel-spindle assembly for use in the process of the invention.
Figure 2B:
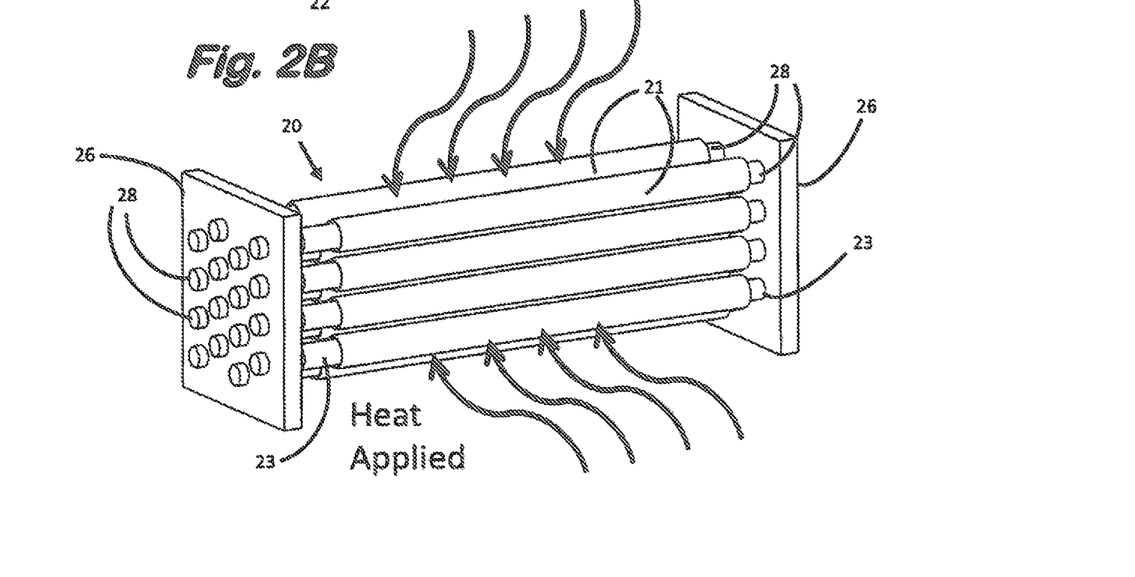
Figure 2C:
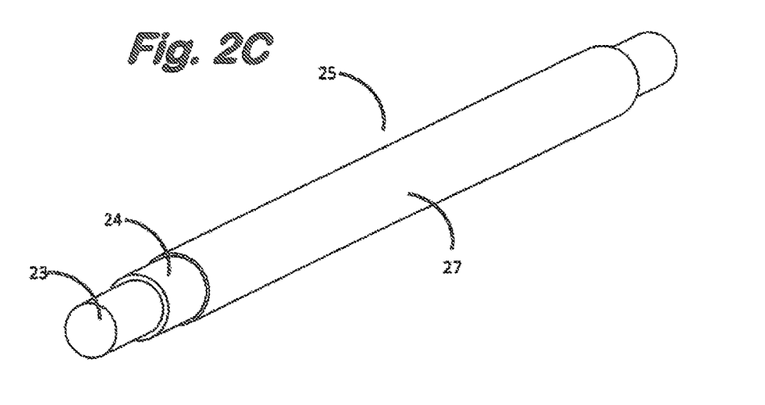

Referring to the drawings illustrating the production, in accordance with the process of the invention, of a tubular ceramic structure as exemplified by tubular anode component 11 of tubular SOFC unit 10 of FIG. 1, the forming of mandrel-spindle assembly 25 of FIG. 2C is illustrated in FIGS. 2A and 2B.

As indicated above, the mandrel-spindle assembly employed in the process of the invention includes a mandrel component and a spindle component, the mandrel component being fabricated from a heat-shrinkable polymeric tube and having an external surface corresponding to the internal surface of the tubular ceramic structure to be produced and an internal surface defining a bore which is in close fitting but slidably removable contact with the external surface of the spindle component. Since the diameter of stock sections of heat shrinkable polymeric tubing seldom provide the requisite close fit, slidably removable contact, with the external surface of the spindle (whose outside diameter defines the inside diameter of the tubular ceramic structure, e.g., tubular anode, to be produced), it is often necessary to heat-shrink oversized stock tubing upon the spindle to provide the mandrel-spindle assembly for use in the production of a particular tubular ceramic structure in accordance with the process of the invention. One suitable procedure for providing the mandrel-spindle assembly employed in the process of the invention is illustrated to FIGS. 2A-2C.

As shown in FIG. 2A, mandrel-spindle subassembly 20 includes oversized mandrel 21 possessing a bore 22 of sufficient diameter as to loosely accommodate spindle 23 and its optional closely fitting, removable or non-removable, friction-reducing polymer cladding, or covering 24. Mandrel 21 will generally possess a length corresponding to the length of tubular anode 11 but somewhat less than the full length of spindle 23.

Oversized mandrel 21 is fabricated from a heat shrinkable, or shape-memory, polymer numerous kinds of which are known in the art, e.g., those described in Lendlein et al, "Shape-Memory Polymers", *Angew. Chem. Int. Ed.* 2002, 41, 2034-2057 (WILEY-VCH Verlag GmbH). Specific useful heat shrinkable polymers include, e.g., polyethylene terephthalate (PET), block copolymers of PET and polyethylene oxide (PET-PEO) and block copolymers of polystyrene and poly(1,4-butadiene) to name but a few.

Spindle 23 can be formed from any suitably rigid material, i.e., one that resists flexing or other deformation when undergoing rotation, such as metal, e.g., aluminum, steel, bronze, etc., glass or other ceramic, non-reinforced or reinforced polymer, etc. Spindle 23 can be a solid structure as shown, a hollow structure such as a tube, a composite of different materials, e.g., a solid or hollow metal core whose exterior surface may optionally be clad with a friction-reducing polymer the function of which is to facilitate the removal of heat-shrunk mandrel 27 (shown in FIG. 2C) at a later point in the process of the invention. In the embodiment of spindle 23 shown in FIG. 2A, the spindle is of solid metal construction, e.g., steel, clad with friction-reducing polymeric layer 24. Optional cladding 24 can be fabricated from a friction-reducing polymer such as polyfluorotetraethylene (PTFE). In place of polymeric cladding 24, spindle 23 can be coated with a lubricious material. Suitable lubricious materials include organic lubricants such as liquid petroleum-based lubricants, natural and synthetic waxes, polyalphaolefins, and the like, and inorganic lubricants in particulate form such as boron nitride, graphite, molybdenum sulfide, and the like.

FIG. 2B illustrates the first heat shrinking treatment whereby expanded mandrel 21 of mandrel-spindle subassembly 20 is made to undergo shrinkage to a first reduced size providing close fitting, slidably removable mandrel 27 of mandrel-spindle assembly 25 illustrated in FIG. 2C. As shown in FIG. 2B, an array of mandrel-spindle subassemblies 20 are disposed between a pair of end plates 26, each end plate possessing an array of apertures 28 for receiving the cylindrical end portions of spindle 23 of each mandrel-spindle subassembly thereby supporting the subassemblies, in this particular case, in a substantially horizontal orientation. The supported array of mandrel-spindle subassemblies is then subjected to heat shrinking treatment carried out under conditions of temperature and time sufficient to cause each expanded mandrel 21 to undergo shrinkage to a first reduced size in which it assumes a close but slidably removable fit with its spindle 23 thereby providing shrunken mandrel 27 of mandrel-spindle assembly 25 of FIG. 2C. For mandrel 21 fabricated from polyethylene terephthalate polymer, this first heat shrinking treatment can advantageously be carried out by subjecting the supported array of mandrel-spindle subassemblies 20 to a temperature within the range of from 105 to 180° C. for an exposure time of from 5 to 45 minutes.

As one alternative to the aforedescribed operation of heat shrinking oversized mandrel 21 directly onto spindle 23, a length of oversized heat shrinkable polymeric tubing of a length equal to several lengths of oversized mandrel 21 can be heat shrunk upon a rigid support, e.g., a stainless steel rod, optionally possessing a friction-reducing cladding or lubricant such as any of those mentioned, and having an outside diameter equal to spindle 23. Following the heat shrinking of the tubing to where it closely fits the exterior surface of the rigid support, the latter is removed, the heat shrunk tubing is cut to individual lengths providing several heat-shrunk mandrels 27 and spindle 23 is inserted in the bore of an individual mandrel 27 to provide the mandrel-spindle assembly of FIG. 2C.

The selected anode-forming composition can be applied to the external surface of rotating mandrel-spindle assembly 25 employing any suitable means, e.g., spraying which is generally preferred, roller or brush-coating employing a doctor blade for removal of excess slurry, and similar procedures.

FIG. 3 illustrates a preferred spraying procedure for applying an anode-forming composition such as those described above to the external surface of mandrel component 27 of mandrel-spindle assembly 25 of FIG. 2C, namely, ultrasonic spraying, to provide anode component 11 of SOFC unit 10 of FIG. 1. Mandrel-spindle assembly 25 is securely mounted and locked in place within traveling support frame 31 of ultrasonic spray apparatus 30 by means of adjustable screw or collet 32. Drive motor 33 rotates mandrel-spindle assembly 25 at adjustable rates, e.g., from 5 to 150 r.p.m., during operation of overhead stationary ultrasonic spray nozzle 34 which receives anode-forming composition from a remote source (not shown) and an atomizing gas, advantageously air. Feed pressures for both the anode-forming composition and the atomizing gas supplied to ultrasonic spay nozzle 34 and the distance between the tip of the spray nozzle and the external surface of mandrel 27 as with other spraying operational parameters can be adjusted to provide optimal spraying conditions for a particular anode-forming operation. In general, anode-forming composition and atomizing gas can be fed to ultrasonic spray nozzle 34 at pressures sufficient to deposit from 0.3 to 30,000 mg/sec of the composition upon the external surface of mandrel 27 with the distance between the tip of the nozzle and the external surface of the mandrel being maintained at from 0.5 to 10.0 cm.

Traveling frame 31 is repeatedly driven in back-and-forth cycles upon horizontal support track 35 by drive belt 36 at adjustable rates, e.g., from 0.1 to 100.0 cm/sec, during the spraying operation for a number of cycles sufficient to provide an anode of predetermined wall thickness, e.g., from 0.25 to 5.0 mm. The number of cycles required for a particular tubular anode structure will depend largely upon the wall thickness desired, the length of the anode, the quantity of anode-forming composition deposited upon the external surface of the rotating mandrel per unit of time and similar factors.

It is, of course, within the scope of this invention to change or modify one or more aspects of the spraying apparatus of FIG. 3, e.g., to provide a traveling (reciprocating) spray nozzle and a fixed support frame, to provide two or more spray nozzles capable of independent operation so as to alter the composition of the anode as it is being formed, to utilize a spray nozzle oriented in other than the overhead position shown, to provide 3-axis movement of the spray nozzle, etc.

An ultrasonic spray apparatus of the generally described type is commercially available from Sono-Tek Corporation, Milton, N.Y. A suitable ultrasonic nozzle for this and similar spraying apparatus is described in U.S. Pat. No. 7,712,680.

Figure 4:
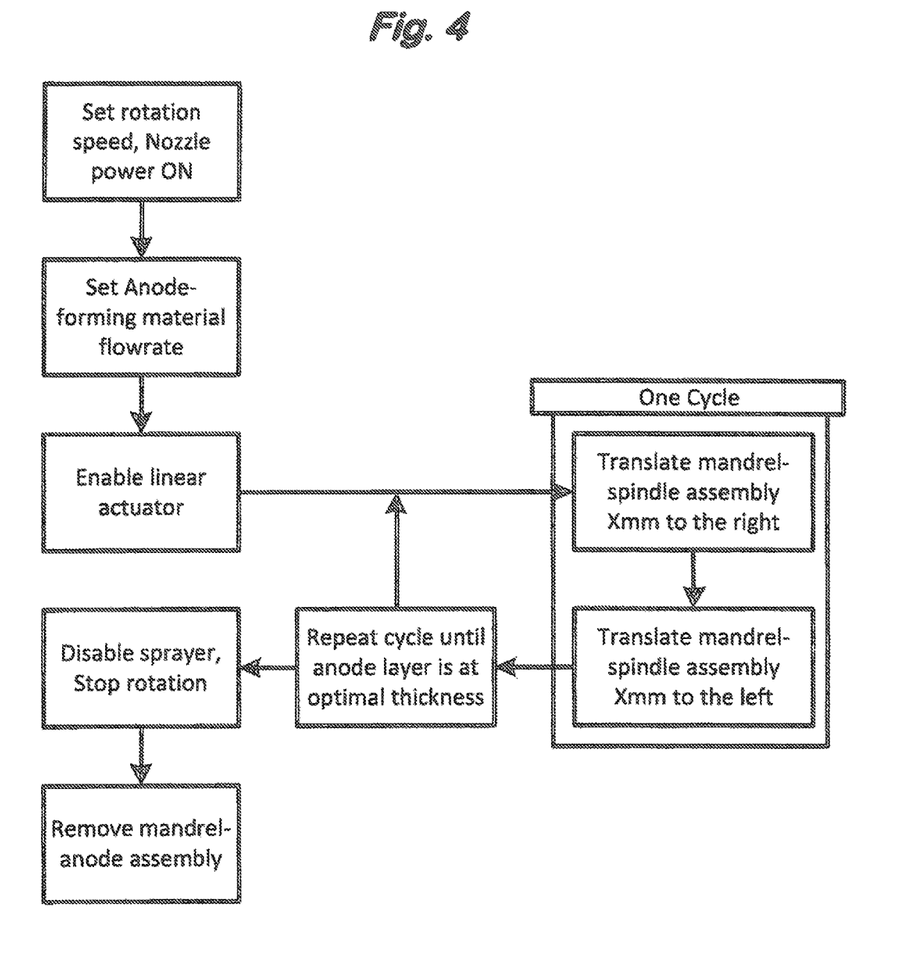
FIG. 4 is a logic flow diagram for one embodiment of computerized control of the ultrasonic spraying operation shown in FIG. 3; and, FIGS. 5A and 5B illustrate, respectively, the heating of the mandrel-tubular anode assembly to shrink the mandrel to its second further reduced size whereby the external surface of the mandrel separates from the interior surface of the anode.

FIG. 4 represents a logic flow diagram for one embodiment of a computerized system of control of the spraying operation illustrated in FIG. 3.

Figure 5A:
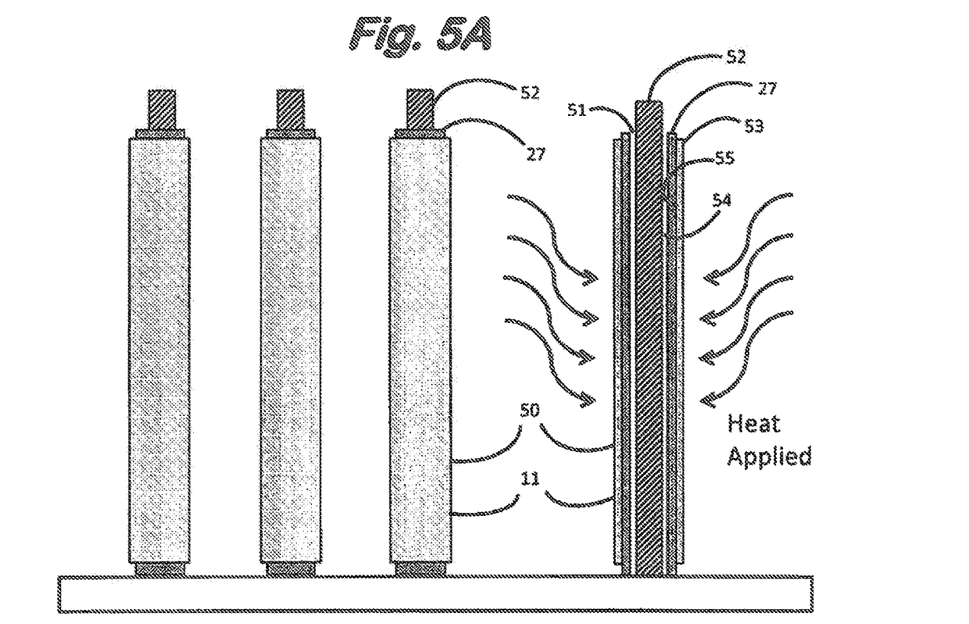
Figure 5B:
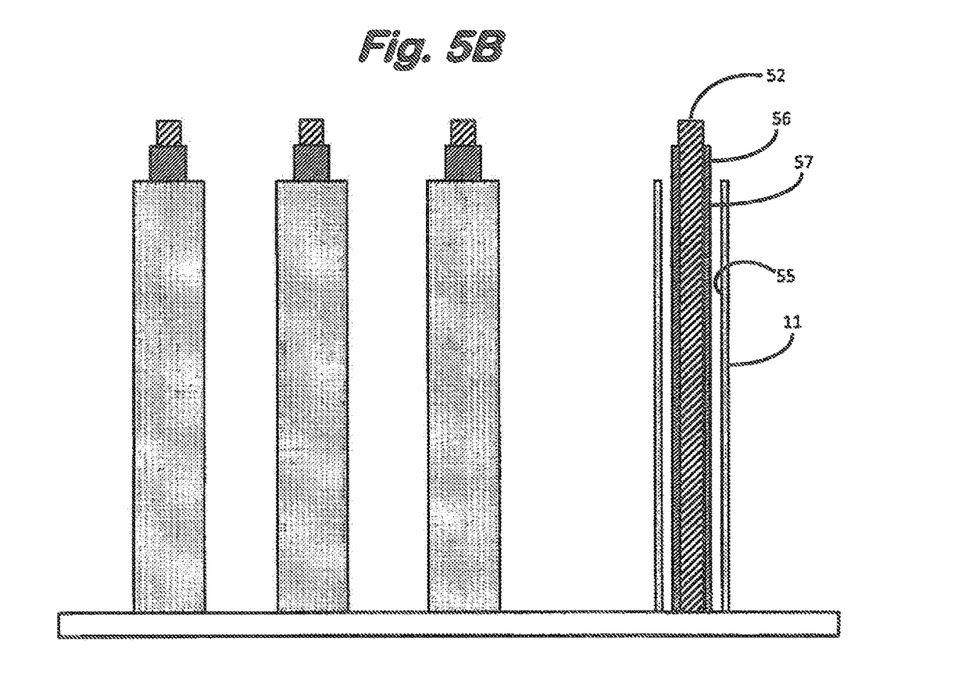

In the following operation for producing anode component 11 and as illustrated in FIGS. 5A and 5B, after removing spindle 23 from the anode-coated mandrel-spindle assembly 25 resulting from the aforedescribed spraying operation, the spindle-free assembly, now designated mandrel-anode assembly 40 and possessing bore 51, is mounted upon vertical pin 52, there being sufficient clearance between interior surface 53 of mandrel 27 and external surface 54 of pin 52 to allow the mandrel when subjected to the second heat shrinking treatment to undergo further shrinkage thereby pulling away from interior surface 55 of anode 11. For production efficiency, an array of vertically mounted mandrel-anode assemblies 50 as shown in FIG. 5A is subject to the second heat treating operation. As in the case of the first heat shrinking treatment shown in FIG. 2B, the temperature and time conditions for effecting this further shrinkage of the mandrel will depend to a large extent on the heat shrinking characteristics of the polymer from which the mandrel is made.

In the particular case where mandrel 27 is formed from polyethylene terephthalate, suitable conditions for the second heat shrinking treatment include a temperature of from 120 to 350° C. and an exposure time of from 1 to 100 minutes.

As a result of this second heat shrinking treatment, and as shown in FIG. 5B, mandrel 27 undergoes another reduction in size, i.e., to the second reduced size of mandrel 56 in which external surface 57 thereof completely separates from interior wall 47 of tubular anode structure 11 allowing the anode to be readily separated from mandrel 27 without incident and thereafter subjected, if desired, to one or more further production operations such as the formation thereon of one or more additional layers, e.g., interlayer thin film(s), electrolyte, cathode, etc., burning out of organics, sintering, and so forth. It is also within the scope of the invention to form a tubular structure upon mandrel 27 which is equal in length to several lengths of tubular anode 11 and thereafter to subdivide the tubular structure into the desired lengths of tubular anode 11.

The process of the invention is generally applicable to the production of all manner of tubular ceramic structures including, without limitation, tubular anode components of a SOFC unit encompassing a wide range of lengths, outside diameters and wall thicknesses. For example, the process can be used to provide a tubular ceramic structure, e.g., a tubular anode, possessing one of the following sets of dimensions:

| Set of Dimensions | Length (mm) | Outside Diameter (mm) | Wall Thickness (mm) |
|---|---|---|---|
| A | 20 to 1000 | 1 to 50 | 0.100 to 5 |
| B | 50 to 500 | 2 to 30 | 0.200 to 3 |
| C | 100 to 250 | 5 to 20 | 0.25 to 2 |

The following example is illustrative of the process of the invention for producing a tubular anode component of an SOFC unit in the green state, i.e., the state in which the anode is self-supporting but still contains organic components such as residual solvent, dispersant, binder, etc.

EXAMPLE

A green state tubular anode is produced possessing the following dimensions: length of 230 mm, outside diameter of 6.35 mm and wall thickness of 0.50 min.

An anode-forming composition in the form of organic solvent slurry is provided by combining the following ingredients in the indicated amounts:

| Component | Amount (g) |
|---|---|
| 8-mol % yttrium zirconium oxide powder | 2.10 |
| NiO powder | 3.90 |
| methylethylketone (MEK) | 10.0 |
| polyvinylpyrrolidone (PVP) powder | 2.00 |

The tubular anode is produced from the foregoing anode-forming composition employing the following operations.

(a) Forming the Mandrel-Spindle Assembly

Stock heat-shrinkable polyethylene terephthalate (PET) cylindrical tubing having an outside diameter of 7.6 mm is divided into 230 mm lengths with each tubular section being weighed to within ±0.01 g accuracy. A cylindrical spindle of 305 mm length clad with a friction-reducing layer of polytetrafluoroethylene (PTFE) for a total spindle diameter of 6.35 mm is inserted into the bore of a PET tubular section to provide a pre-shrunk oversized mandrel-spindle subassembly. The subassembly is heated in a convection oven to 110° C. for 10 min, to shrink the PET tubular section (the oversized mandrel component of the subassembly) to the point where the mandrel becomes closely fitted to, but slidably removable from the spindle thus providing a mandrel-spindle assembly.

(b) Spraying the Anode-Forming Composition Upon the Surface of the Mandrel-Supported Tubular Anode The mandrel-spindle assembly is installed in the traveling support frame of a FlexiCoat ultrasonic spray coating apparatus (Sono-Tek Corporation, Milton, N.Y.). Distance of the ultrasonic nozzle to the surface of the mandrel is 15 mm. The mandrel-spindle assembly is rotated about its longitudinal axis at a rate of 125 r.p.m. during the spraying operation. The ultrasonic spray nozzle delivers approximately 0.5 ml/sec of anode-forming composition in a slightly bowed-shape spray pattern of microdroplets to the complete surface of the rotating mandrel. By the time the spray impinges on the surface of the rotating mandrel, sufficient evaporation of the volatile component of the anode-forming composition, namely, its methylethylketone (MEK) slurry-forming component, has taken place so that the sprayed material, now semi-dry, adheres to the mandrel as a substantially uniform coating or layer thereon. Continuous back-and-forth (reciprocal) motion of the traveling support frame of the spraying apparatus results in the increasing accumulation of anode-forming composition on the surface of the mandrel. After a predetermined period of time (or number of spraying cycles), spraying is discontinued, the spindle is removed from the coated mandrel to provide a mandrel-tubular anode assembly and the latter is weighed to within ±0.01 g from which it is calculated that 5.6 g anode-forming composition, now substantially devoid of its volatile MEK component, has been deposited on the mandrel as a tubular anode structure having the dimensions indicated above.

(c) Heat-Treating the Mandrel-Tubular Anode Assembly to Further Heat Shrink the Mandrel The mandrel-tubular anode assembly is vertically supported upon a ceramic pin having a diameter that is smaller, e.g., 20-30% smaller, than the interior diameter of the mandrel. The supported mandrel is placed in a convection oven and heated to the target temperature of 250° C. at a heating and cooling rate of 1° C./min. and a dwell time at the target temperature of 60 minutes. As a result of this heat treatment, the mandrel shrinks and separates from the interior surface of the tubular anode from which the mandrel is now readily removed.

Although the invention has been described in detail for the purpose of illustration, it is understood that such detail is solely for that purpose, and variations can be made therein by those skilled in the art without departing from the spirit and scope of the invention which is defined in the claims.

What is claimed is:

1. A process for producing tubular ceramic structures which comprises:
    rotating a mandrel-spindle assembly comprising a mandrel component and a spindle component, the mandrel component being a heat shrinkable polymeric tube the external surface of which corresponds to the internal surface of the tubular ceramic structure to be produced and the internal surface of which defines a bore, the spindle component being in close fitting but slidably removable contact therewith;
    applying a ceramic-forming composition to the external surface of the mandrel component of the rotating mandrel-spindle assembly to produce a tubular ceramic structure the internal surface of which is in contact with the external surface of the mandrel component;
    removing the spindle component from the bore of the mandrel component to provide a mandrel-tubular ceramic structure assembly in which the interior surface of the tubular ceramic structure remains in contact with the external surface of the mandrel component; and,
    heat shrinking the mandrel component of the mandrel-tubular ceramic structure assembly to cause the mandrel component to undergo shrinkage to a reduced size in which the external surface of the mandrel component separates from the interior surface of the tubular ceramic structure facilitating removal of the mandrel component therefrom.

2. The process of claim 1 wherein the mandrel component is fabricated from shape memory polymer selected from the group consisting of polyethylene terephthalate, block copolymer of polyethylene terephthalate, block copolymer of polystyrene and poly(1,4-butadiene) and blends and alloys thereof.

3. The process of claim 1 wherein the ceramic-forming composition is an anode-forming composition for producing the tubular anode component of a tubular solid oxide fuel cell.

4. The process of claim 1 wherein the ceramic-forming composition is applied to the external surface of the mandrel component by ultrasonic spraying.

5. The process of claim 3 wherein the anode-forming composition is applied to the external surface of the mandrel component by ultrasonic spraying.

6. The process of claim 3 wherein the anode-forming composition comprises:
    a particulate ceramic;
    a source of particulate metal;
    a slurry-forming liquid; and
    a dispersant.

7. The process of claim 6 wherein the anode-forming composition further comprises a binder and/or binder-forming material when the dispersant does not function as a binder.

8. The process of claim 7 wherein:
    the particulate ceramic comprises at least one member selected from the group consisting of yttrium oxide, zirconium oxide, cerium oxide, lanthanum oxide, gallium oxide, strontium oxide, magnesium oxide, scandium oxide, samarium oxide, praseodymium oxide and mixtures thereof;
    the source of particulate metal comprises at least one member selected from the group consisting of nickel, copper, silver, platinum, ruthenium, palladium, compounds, and oxides thereof;
    the slurry-forming liquid comprises at least one member selected from the group consisting of water, an organic solvent, and mixtures thereof;
    the dispersant comprises at least one member selected from the group consisting of polymer electrolyte, an organic acid, a copolymer of butadiene, isobutylene and/or styrene with maleic anhydride, a phthalate ester, and mixtures thereof; and,
    the binder, when present, comprises at least one member selected from the group consisting of a gellable or swellable polymer, a crosslinked polymeric binder-forming mixture providing crosslinked binder in situ, and mixtures thereof.

9. The process of claim 1 wherein the ceramic-forming composition possesses a viscosity of from 1 to 500,000 cP at 20° C.

10. The process of claim 5 wherein the anode-forming composition possesses a viscosity of from 1 to 100 cP at 20° C.

11. The process of claim 8 wherein the anode-forming composition is applied to the external surface of the mandrel by ultrasonic spraying.

12. The process of claim 1 wherein the formulation of the ceramic-forming composition is changed or modified during the applying step.

13. The process of claim 5 wherein the formulation of the anode-forming composition is changed or modified during the applying step.

14. The process of claim 13 wherein the anode-forming composition is changed or modified during the applying step for a selected section of the tubular anode component.

15. The process of claim 1 wherein the external surface of the spindle component possesses an anti-friction cladding or lubricious coating to facilitate removal of the spindle component from the mandrel-spindle assembly.

16. The process of claim 1 wherein the tubular ceramic structure possesses one of the following sets of dimensions:

| Set of Dimensions | Length (mm) | Outside Diameter (mm) | Wall Thickness (mm) |
| --- | --- | --- | --- |
| A | 20 to 1000 | 1 to 50 | 0.100 to 5 |
| B | 50 to 500 | 2 to 30 | 0.200 to 3 |
| C | 100 to 250 | 5 to 20 | 0.25 to 2 |

17. The process of claim 1 further comprising:

after applying the ceramic-forming composition, applying a second and different ceramic-forming composition to an external surface of the rotating tubular ceramic structure.

18. The process of claim 1 wherein the ceramic-forming composition is applied to the external surface of the mandrel component as a slurry of particulates.

19. The process of claim 18 wherein the ceramic-forming composition comprises:

a particulate ceramic;

a source of particulate metal;

a slurry-forming liquid; and a dispersant.

20. The process of claim 18 wherein the ceramic-forming composition is applied to the external surface of the mandrel component by ultrasonic spraying.

\* \* \* \* \*